(12) United States Patent
Shin

(10) Patent No.: US 8,730,440 B2
(45) Date of Patent: May 20, 2014

(54) METHOD OF FORMING A VERTICAL ALIGNMENT LAYER, A METHOD OF MANUFACTURING A DISPLAY APPARATUS USING THE SAME, AND A DISPLAY APPARATUS MADE WITH THE MANUFACTURING METHOD

(75) Inventor: Kyoungju Shin, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 204 days.

(21) Appl. No.: 13/348,966

(22) Filed: Jan. 12, 2012

(65) Prior Publication Data

US 2012/0194753 A1  Aug. 2, 2012

(30) Foreign Application Priority Data

Feb. 1, 2011 (KR) .................. 10-2011-0009986

(51) Int. Cl.
*G02F 1/1337* (2006.01)

(52) U.S. Cl.
USPC ........................................... 349/129

(58) Field of Classification Search
USPC ........................................... 349/129
See application file for complete search history.

(56) References Cited

U.S. PATENT DOCUMENTS

| 6,856,368 | B2 | 2/2005 | Terashita et al. |
| 7,133,099 | B2 | 11/2006 | Yoshida et al. |
| 8,330,906 | B2 * | 12/2012 | Hashimoto et al. ........... 349/110 |
| 2005/0062920 | A1 * | 3/2005 | Chaudhari et al. ............ 349/129 |
| 2009/0190058 | A1 * | 7/2009 | Jung et al. ....................... 349/48 |
| 2011/0085097 | A1 * | 4/2011 | Lee et al. ......................... 349/33 |

FOREIGN PATENT DOCUMENTS

| JP | 2010-134483 | 6/2010 |
| KR | 1020080114352 | 12/2008 |
| KR | 1020100032323 | 3/2010 |

* cited by examiner

*Primary Examiner* — Phu Vu
(74) *Attorney, Agent, or Firm* — F. Chau & Associates, LLC

(57) ABSTRACT

A method of forming a vertical alignment layer includes disposing a substrate on a stage, the substrate including an alignment layer, the alignment layer includes first areas and second areas alternately arranged in a first direction, and disposing a mask over the substrate, the mask including light blocking parts and light transmitting parts that correspond to the first areas. An exposure apparatus disposed over the mask provides light to the first areas when the substrate moves in the first direction to form a pretilt angle in the first areas. The stage is rotated so that the light transmitting parts correspond to the second areas, and the exposure apparatus provides light to the second areas when the substrate moves in the first direction to form a pretilt angle in the second areas. The pretilt angle formed in the first areas is different from the pretilt angle formed in the second areas.

17 Claims, 15 Drawing Sheets

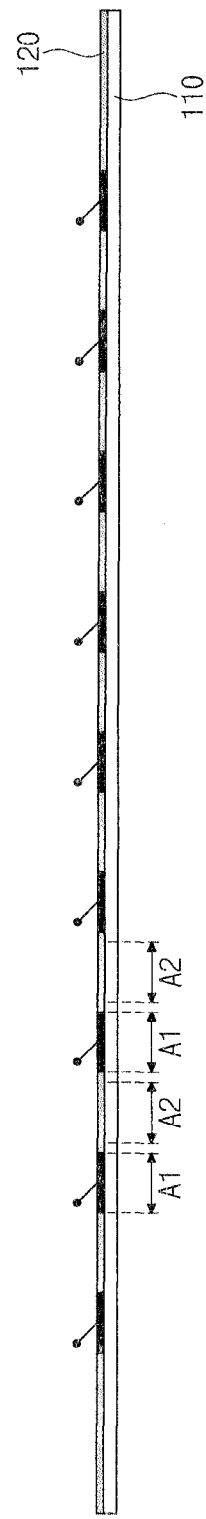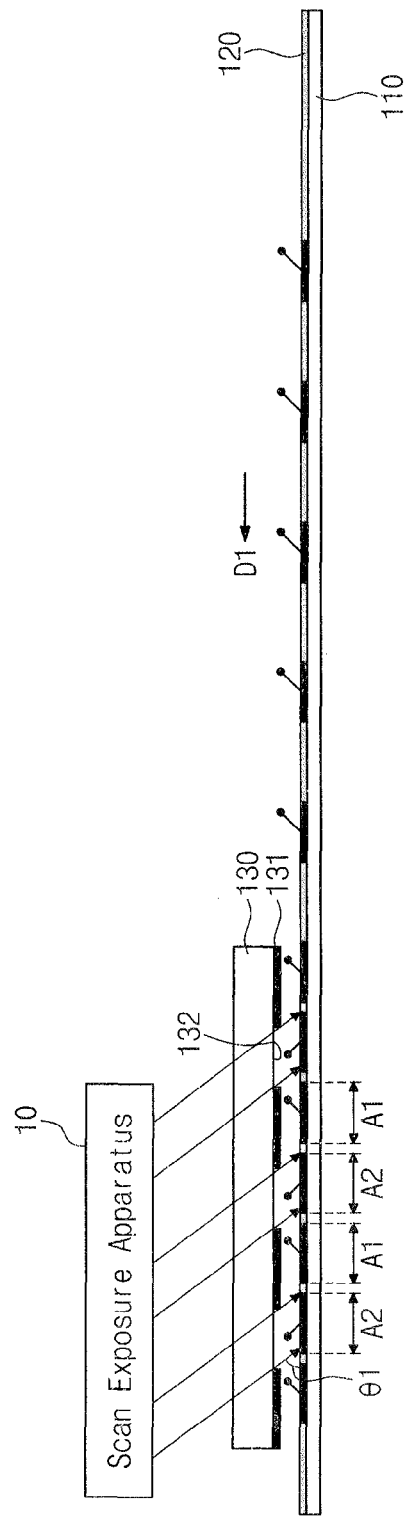

METHOD OF FORMING A VERTICAL ALIGNMENT LAYER, A METHOD OF MANUFACTURING A DISPLAY APPARATUS USING THE SAME, AND A DISPLAY APPARATUS MADE WITH THE MANUFACTURING METHOD

CROSS-REFERENCE TO RELATED APPLICATION

This application claims priority to Korean Patent Application No. 10-2011-0009986 filed on Feb. 1, 2011, the disclosure of which is incorporated by reference herein in its entirety.

BACKGROUND

1. Technical Field

The present invention relates to a method of forming a vertical alignment layer, a method of manufacturing a display apparatus using the same, and a display apparatus made with the manufacturing method.

2. Discussion of the Related Art

In general, in a liquid crystal display, a voltage is applied to a liquid crystal layer to control a transmittance of light passing through the liquid crystal layer, thereby displaying an image. The liquid crystal display may be classified as a twisted nematic liquid crystal display, a horizontal electric field liquid crystal display, or a vertical alignment liquid crystal display according to the characteristics of the liquid crystal layer.

Liquid crystal molecules in the vertical alignment liquid crystal display are arranged in a predetermined direction such that their long axes are perpendicular to a screen of the display in the absence of an electric field. Thus, a viewing angle of the vertical alignment liquid crystal display is wide and a contrast ratio of the display is high.

The liquid crystal molecules may be aligned by using alignment films manufactured with a rubbing method or a light alignment method. In the light alignment method, a plural number of masks are used. Accordingly, there is a need to reduce the number of masks in an alignment film manufacturing process.

SUMMARY

According to an exemplary embodiment of the present invention, a method of forming a vertical alignment layer is provided. A substrate is disposed on a stage, the substrate includes an alignment layer, wherein the alignment layer includes first areas and second areas alternately arranged in a first direction. A mask is disposed over the substrate, the mask including light blocking parts that block light and light transmitting parts through which light passes and that correspond to the first areas. An exposure apparatus is disposed over the mask. The exposure apparatus provides first light pulses to the first areas while the substrate moves in the first direction to form a pretilt angle in the first areas. The stage rotates so that the light transmitting parts correspond to the second areas. The exposure apparatus provides second light pulses to the second areas while the substrate moves in the first direction to form a pretilt angle in the second areas. The pretilt angle in the first areas is different from the pretilt angle in the second areas.

The first and second areas extend in a second direction substantially perpendicular to the first direction, the first areas are light aligned in the first direction, and the second areas are light aligned in a third direction opposite to the first direction.

The difference between the pretilt angle of the first areas and the pretilt angle of the second areas is about 180 degrees.

An area of the substrate that is exposed for a time through the mask is defined as a first exposure area, N pitches repeatedly appear in the first exposure area, each pitch is a period of time where one of the light transmitting parts and one of the light blocking parts overlaps a portion of the first exposure area, and N is a constant number.

A moving speed of the substrate satisfies the following Equation, $$v = (P1 \times n)/T1$$

where P1 denotes one of the pitches, n is a constant number smaller than N, and T1 denotes one period of the first or second light pulses.

The exposure apparatus is turned on during a first time interval of the one period to output the first or second light pulse and is turned off during a second time interval of the one period not to output the first or second light pulse.

A moving distance of the substrate during the first time interval is defined as d1, and d1 satisfies the following Equation, $$d1 = \frac{H1}{T1}(P1 \times n)$$

where H1 denotes the first time interval.

According to an exemplary embodiment of the present invention, a method of manufacturing a display apparatus includes forming a first alignment layer on a first substrate, wherein the first substrate includes a plurality of pixel electrodes, forming a second alignment layer on a second substrate, wherein the second substrate includes a reference electrode, and disposing a liquid crystal layer between the first alignment layer and the second alignment layer, the liquid crystal layer including liquid crystal molecules that are vertically aligned with respect to the first or second alignment layer.

At least one of the first alignment layer or the second alignment layer includes first areas and second areas alternately arranged in a first direction, and the at least one alignment layer is formed as follows.

Disposing a substrate having the at least one alignment layer on a stage. Disposing a mask over the substrate, the mask including light blocking parts that block light and light transmitting parts through which light passes and that corresponds to the first areas.

Disposing an exposure apparatus over the mask. Providing, from the exposure apparatus, first light pulses to the first areas while the substrate moves in the first direction to form a pretilt angle in the first areas.

Rotating the stage so that the light transmitting parts correspond to the second areas. Providing, from the exposure apparatus, second light pulses to the second areas while the substrate moves in the first direction to form a pretilt angle in the second areas. The pretilt angle formed in the first areas is different from the pretilt angle formed in the second areas.

At least one alignment layer divides a pixel electrode into a plurality of domains to pretilt the liquid crystal molecules in the domains.

The other of the first and second alignment layers is formed in substantially the same way as the at least one alignment layer, the first and second areas in the first and second alignment layers extend in a second direction substantially perpendicular to the first direction, the first areas in the first alignment layer are light aligned in the first direction, the second areas in the first alignment layer are light aligned in a third direction opposite to the first direction, the first areas of the second alignment layer are light aligned in the second direction, and the second areas of the second alignment layer are light aligned in a fourth direction opposite the second direction.

An area of the substrate that is exposed for a time through the mask is defined as a first exposure area, N pitches repeatedly appear in the first exposure area, each pitch is a period of time where one of the light transmitting parts and one of the light blocking parts overlaps a portion of the first exposure area, and N is a constant number.

A moving speed of the substrate satisfies the following Equation, $$v=(P1 \times n)/T1$$

where P1 denotes one of the pitches, n is a constant number smaller than N, and T1 denotes one period of the first or second light pulses.

The exposure apparatus is turned on during a first time interval of the one period to output the first or second light pulse and is turned off during a second time interval of the one period not to output the first or second light pulse.

A moving distance of the substrate during the first time interval is defined as d1, and d1 satisfies the following Equation, $$d1 = \frac{H1}{T1}(P1 \times n)$$

where H1 denotes the first time interval.

According to an exemplary embodiment of the present invention, a display apparatus includes a first substrate including a plurality of pixel electrodes, a second substrate including a reference electrode facing the pixel electrodes, a liquid crystal layer disposed between the first substrate and the second substrate and including a plurality of liquid crystal molecules, a first alignment layer disposed on the pixel electrodes, and a second alignment layer disposed on the reference electrode.

At least one of the first alignment layer or the second alignment layer divides a first pixel electrode into a plurality of domains to pretilt the liquid crystal molecules in each domain, and the first pixel electrode includes a plurality of slits formed in each of the domains.

The slits formed in each domain extend in a direction substantially parallel to an alignment direction of the liquid crystal molecules of that domain.

The slits are formed adjacent to a boundary between the domains.

The alignment directions of the liquid crystal molecules in the domains are directed to a center portion where the domains meet each other.

The first pixel electrode comprises a first sub-pixel electrode and a second sub-pixel electrode, and the first sub-pixel electrode receives a voltage different from a voltage received by the second sub-pixel electrode.

According to an exemplary embodiment of the present invention, a method of forming a vertical alignment layer includes irradiating a first area of an alignment layer with first light passing through a mask to form a pretilt angle in the first area, wherein the mask is positioned to prevent a second area of the alignment layer from being exposed by the first light, and wherein the alignment layer is in a first position; moving the alignment layer to a second position; and while the alignment layer is in the second position, irradiating the second area with second light passing through the mask to form a pretilt angle in the second area, wherein the first area is prevented from being exposed by the second light, and wherein the pretilt angle in the first area is different from the pretilt angle in the second area.

BRIEF DESCRIPTION OF THE DRAWINGS

The above and other features of the present invention will become more apparent by describing in detail exemplary embodiments thereof with reference to the accompanying drawings in which:

FIG. 5 is a cross-sectional view showing an alignment layer on which the first exposure process is performed, according to an exemplary embodiment of the present invention;

FIG. 6 is a cross-sectional view showing a second exposure process being performed on an alignment layer, according to an exemplary embodiment of the present invention;

DETAILED DESCRIPTION OF EXEMPLARY EMBODIMENTS

Exemplary embodiments of the present invention will be described more fully hereinafter with reference to the accompanying drawings. However, the present invention may be embodied in various different ways and should not be construed as limited to the exemplary embodiments described herein.

It will be understood that when an element or layer is referred to as being "on," "connected to" or "coupled to" another element or layer, it can be directly on, connected or coupled to the other element or layer or intervening elements or layers may be present. Like numbers may refer to like elements throughout the specification and drawings.

Figure 1:
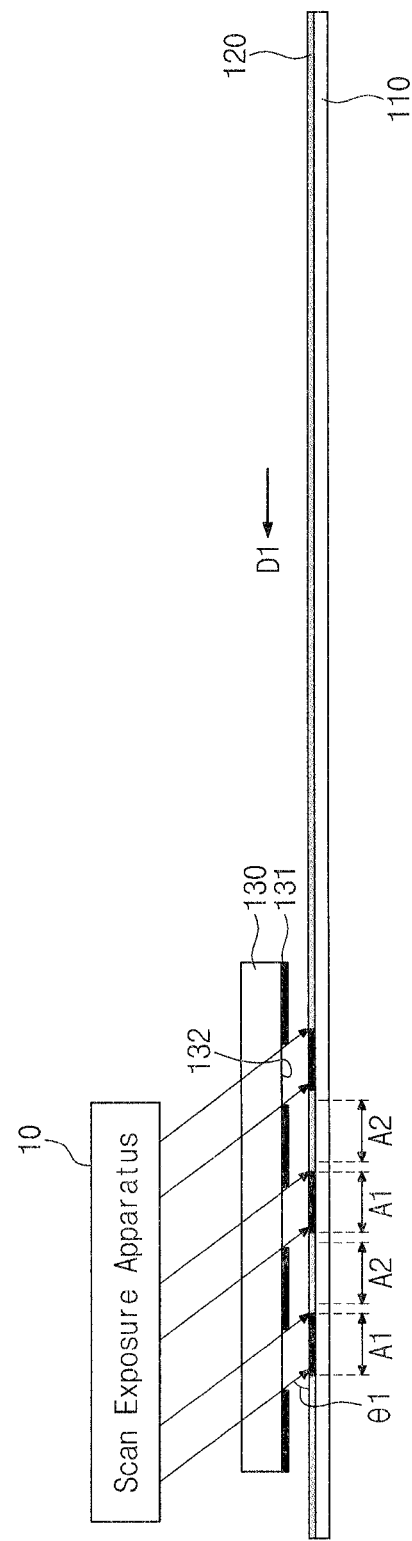
FIG. 1 is a cross-sectional view showing a first exposure process being performed on an alignment layer, according to an exemplary embodiment of the present invention.
Figure 2:
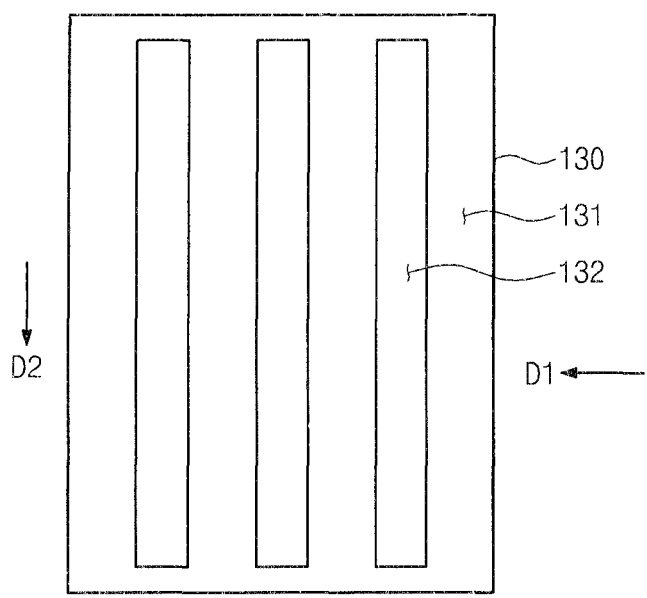
FIG. 2 is a plan view showing a mask shown in FIG. 1, according to an exemplary embodiment of the present invention.

FIG. 1 is a cross-sectional view showing a first exposure process being performed on an alignment layer and FIG. 2 is a plan view showing a mask shown in FIG. 1, according to exemplary embodiments of the present invention.

Referring to FIG. 1, a substrate 110 including an alignment layer 120 is mounted on a stage of a semiconductor manufacturing apparatus, for example. The alignment layer 120 includes a plurality of first areas A1 and a plurality of second areas A2, and the first areas A1 are alternately arranged with the second areas A2 in a first direction D1. The first and second areas A1 and A2 may be alternately arranged in other directions such as a direction slanted with respect to the first direction D1. Further, the first and second areas A1 and A2 may be arranged in other patterns such as two first areas A1 followed by a single second area A2 or a set of three or more second areas A2.

As an example, the alignment layer 120 may include a polymer material in which a decomposition reaction, a dimerization reaction, or an isomerization reaction occurs by irradiating light, such as ultraviolet light, laser, etc. In addition, the first alignment layer 120 may be obtained by blending a cinnamate oligomer and cinnamate-based polymer.

A mask 130 is disposed over the alignment layer 120. The mask 130 includes a light blocking part 131 to block light and a plurality of light transmitting parts 132 to transmit light. When performing a first exposure process, the light transmitting parts 132 are positioned to correspond to the first areas A1 of the alignment layer 120, respectively. Alternatively, the light transmitting parts 132 may be positioned to correspond to the second areas A2 of the alignment layer 120.

As shown in FIG. 2, the light transmitting parts 132 are arranged in the first direction D1 to be spaced apart from each other with a predetermined distance and have a longer length in a second direction D2 substantially perpendicular to the first direction D1. However, the light transmitting parts 132 may be spaced apart from each other by varying distances in the first direction D1.

A scan exposure apparatus 10 is disposed over the mask 130. When the substrate 110 moves in the first direction D1, the scan exposure apparatus 10 provides an ultraviolet light (which hereinafter may be referred to as the UV light pulse) to the mask 130 in a pulse shape to perform a first exposure on the alignment layer 120. In this case, the substrate 110 moves in a direction substantially perpendicular to a direction in which the light transmitting parts 132 extend.

In addition, when performing the first exposure, the scan exposure apparatus 10 may irradiate the UV light pulse on the substrate 110 such that the UV light pulse is inclined by a first angle θ1 with respect to an upper surface of the substrate 110. As an example, the first angle θ1 may be in a range of about 40 degrees to about 45 degrees. To irradiate the UV light pulse to be inclined with respect to the upper surface of the substrate 110, the substrate 110 or the scan exposure apparatus 10 may be inclined.

Figure 3:
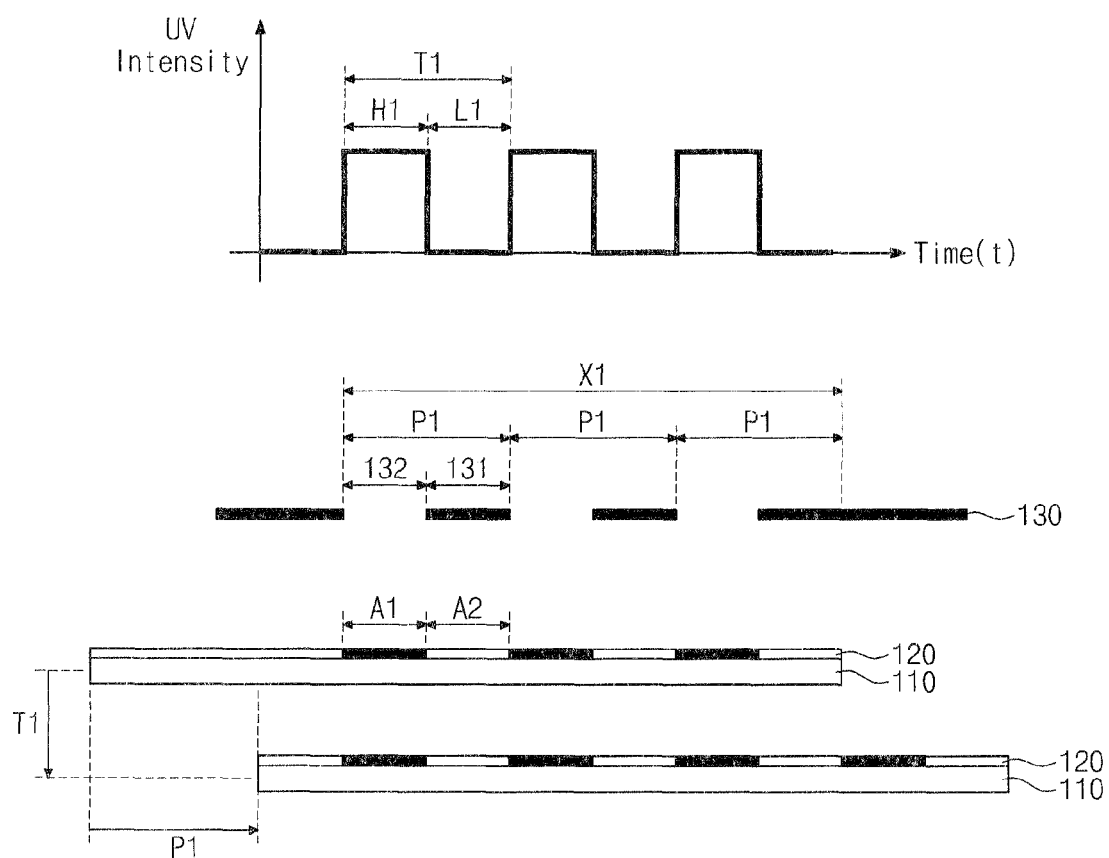
FIG. 3 is a view showing a waveform of an ultraviolet light pulse and a moving distance of a substrate, according to an exemplary embodiment of the present invention.

FIG. 3 is a view showing a waveform of an ultraviolet light pulse and a moving distance of a substrate, according to an exemplary embodiment of the present invention.

Referring to FIG. 3, an area of the substrate 110 exposed for a period of time through the mask 130 is defined as a first exposure area XI, and N pitches P1 repeatedly appear in the first exposure area X1. In the present exemplary embodiment, the pitch P1 indicates a period of time where the light transmitting part 132 and the light blocking part 131 are repeated (in other words, the pitch P1 is a period of time where one of the light transmitting parts 132 and one of the light blocking parts 131 overlaps a portion of the first exposure area), and "N" may be a constant number.

The substrate 110 may move by a constant number (n) times the pitch P1 during a predetermined time interval T1. In this case, "n" is a constant number smaller than "N". Accordingly, the moving speed (v) of the substrate 110 satisfies the following Equation 1.

$$v = (P1 \times n)/T1 \quad \text{Equation 1}$$

The scan exposure apparatus 10 is turned on during a first time interval H1 of the period T1 to output the UV light pulse and is turned off during a second time interval L1 of the period T1 not to output the UV light pulse.

In addition, the UV light pulse may have a duty ratio (H1/T1) of about 50% or less. In other words, the first time interval H1 may be equal to or shorter than the second time interval L1.

Since the substrate 110 moves at constant velocity, a moving distance of the substrate 110 during the first time interval H1 may be varied according to the duty ratio (H1/T1) of the UV light pulse.

In other words, the moving distance of the substrate 110 during the first time interval H1 is referred to as "d1", and "d1" satisfies the following Equation 2.

$$d1 = \frac{H1}{T1}(P1 \times n) \quad \text{Equation 2}$$

In the case that the duty ratio of the UV light pulse is 50% and the substrate 110 moves by one pitch P1 during the period T1, the moving distance d1 of the substrate 110 during the first time interval H1 may be defined by 0.5×P1. In this case, a ratio of the light transmitting part 132 to the one pitch P1 may be set to 1:2, e.g., 50%.

Figure 4:
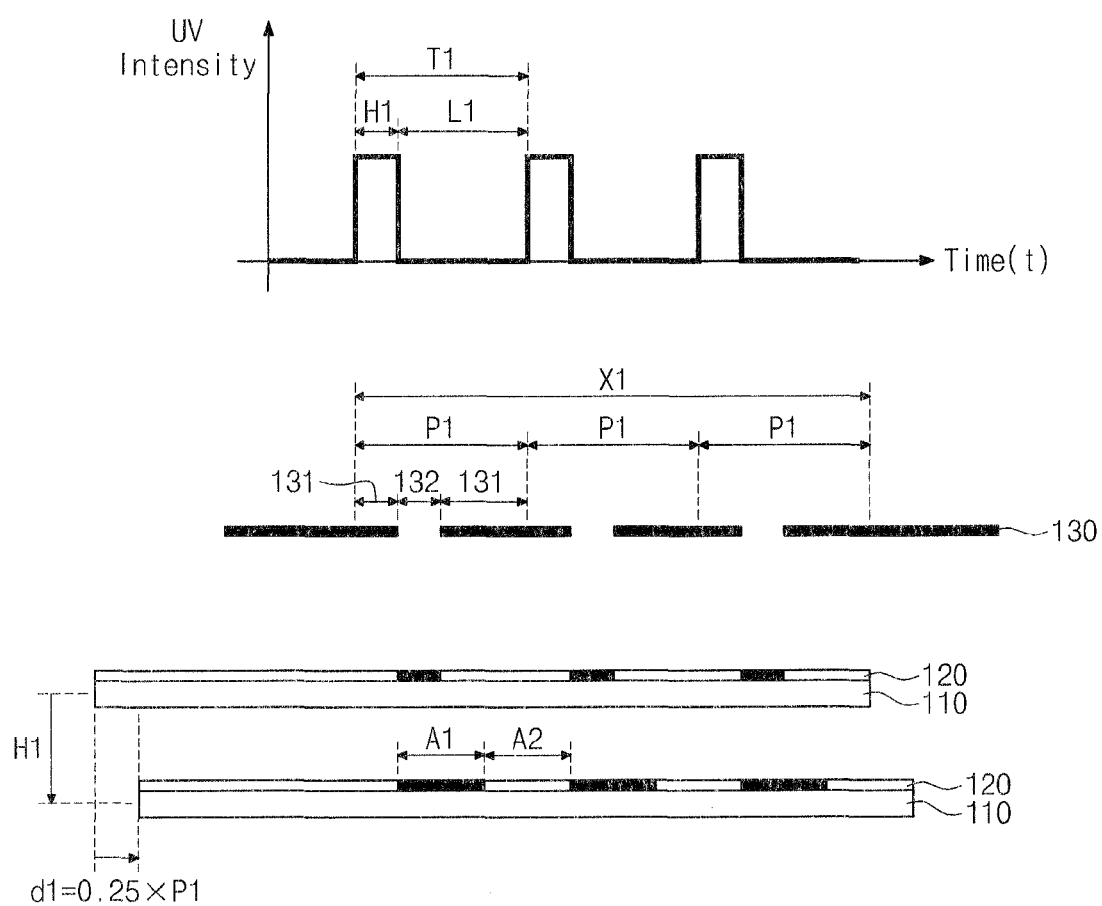
FIG. 4 is a view showing a waveform of an ultraviolet light pulse and a moving distance of a substrate according to an exemplary embodiment of the present invention.

FIG. 4 is a view showing a waveform of an ultraviolet light pulse and a moving distance of a substrate according to an exemplary embodiment of the present invention.

Referring to FIG. 4, in the case that the duty ratio (H1/T1) of the UV light pulse is 25% and the substrate 110 moves by the one pitch P1 during the period T1, the moving distance d1 of the substrate 110 during the first time interval Ill may be defined by 0.25×P1. In this case, a ratio of the light transmitting part 132 to the one pitch P1 may be set to 1:4, e.g., 25%.

FIG. 5 is a cross-sectional view showing an alignment layer 120 on which the first exposure process is performed, according to an exemplary embodiment of the present invention.

Referring to FIG. 5, a pretilt angle, which is inclined in the direction to which the UV light pulse is irradiated, is formed in the first areas A1 of the alignment layer 120. As an example, the pretilt angle may be in a range of about 85 degrees to about 89 degrees. The slanted lines above the first areas A1 in FIG. 5 correspond to the pretilt angles formed in the first areas A1.

Figure 7:
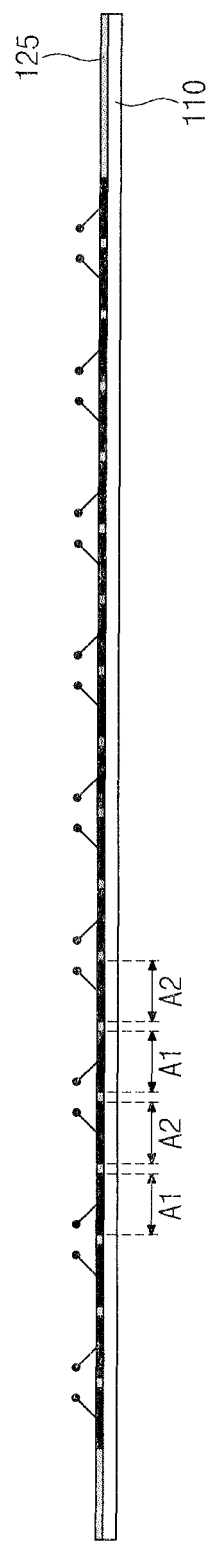
FIG. 7 is a cross-sectional view showing a vertical alignment layer formed after the second exposure process is performed, according to an exemplary embodiment of the present invention.

FIG. 6 is a cross-sectional view showing a second exposure process being performed on an alignment layer 120 and FIG. 7 is a cross-sectional view showing a vertical alignment layer 125 formed after the second exposure process is performed, according to exemplary embodiments of the present invention.

Referring to FIG. 6, the stage is rotated 180 degrees to correspond the light transmitting parts 132 of the mask 130 to the second areas A2 of the alignment layer 120. As can be gleaned, if the first exposure process were performed on the second areas A2, the stage would be rotated at this time to correspond the light transmitting parts 132 of the mask 130 to the first areas A1.

When the substrate 110 moves along the first direction D1, the scan exposure apparatus 10 outputs the UV light pulse to the mask 130 to perform a second exposure on the alignment layer 120.

When performing the second exposure on the alignment layer 120, the scan exposure apparatus 10 may irradiate the UV light pulse on the substrate 110 such that the UV light pulse is inclined by the first angle θ1 with respect to the upper surface of the substrate 110. Thus, a pretilt angle, which is inclined in the direction to which the UV light pulse is irradiated, is formed in the second areas A2 of the alignment layer 120. The short slanted lines above the second areas A2 in FIG. 6 correspond to the pretilt angles formed in the second areas A2 and the long slanted lines above the first areas A1 in FIG. 6 correspond to the pretilt angles formed in the first areas A1.

Referring to FIG. 7, when the second exposure is finished, a vertical alignment layer 125 is formed such that the second areas A2 have a different pretilt angle from the first areas A1. As an example, the pretilt angle in the first areas A1 has a difference of about 180 degrees from the pretilt angle in the second areas A2.

The above-described vertical alignment layer 125 may align liquid crystal molecules of a liquid crystal layer (not shown) to be inclined to different directions by the pretilt angle in the first and second areas A1 and A2 when no electric field is applied to the liquid crystal layer.

Figure 8:
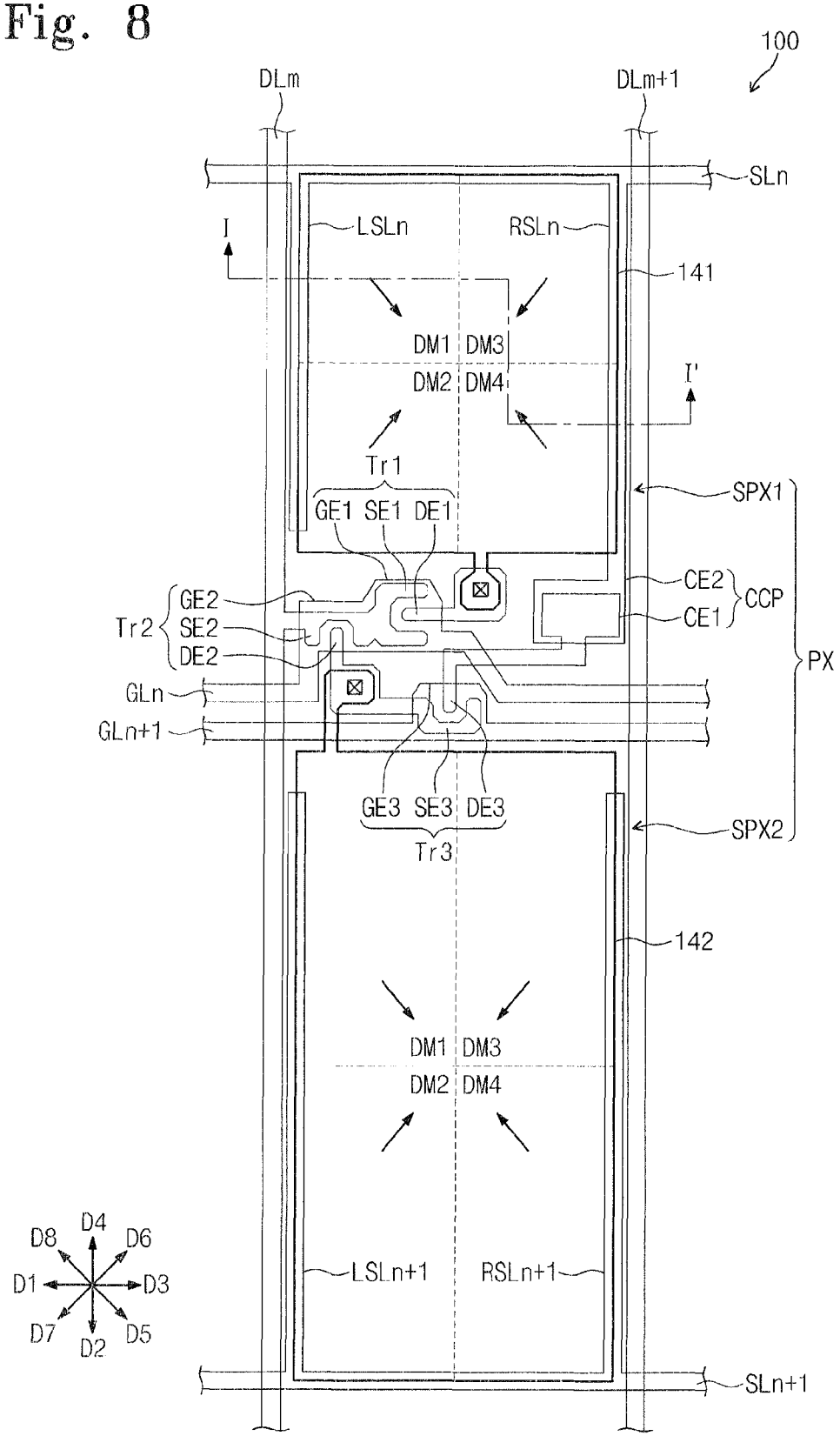
FIG. 8 is a plan view showing a pixel part of a liquid crystal display panel according to an exemplary embodiment of the present invention.
Figure 9:
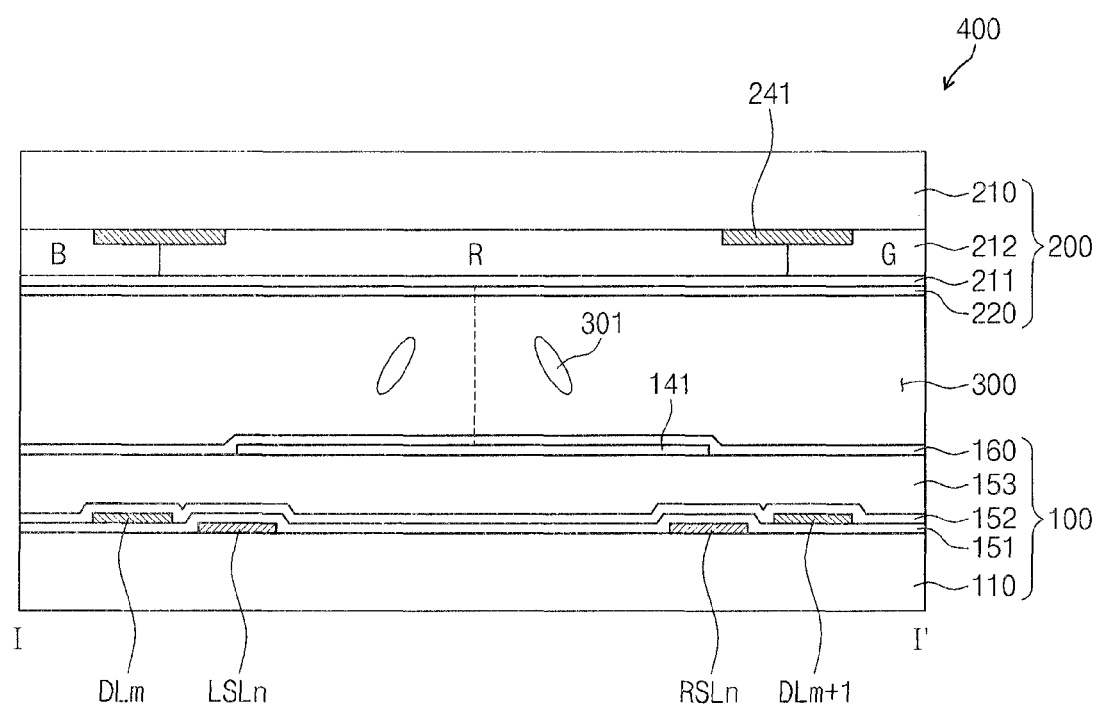
FIG. 9 is a cross-sectional view taken along line I-I' shown in FIG. 8.

FIG. 8 is a plan view showing a pixel part of a liquid crystal display panel according to an exemplary embodiment of the present invention and FIG. 9 is a cross-sectional view taken along line It shown in FIG. 8.

Referring to FIGS. 8 and 9, a liquid crystal display panel 400 includes an array substrate 100, an opposite substrate 200 facing the array substrate 100 while being coupled to the array substrate 100, and a liquid crystal layer 300 with liquid crystal molecules 301 interposed between the array substrate 100 and the opposite substrate 200.

The array substrate 100 includes a plurality of gate lines, a plurality of data lines, and a plurality of pixels arranged in a matrix shape. For the convenience of explanation, one pixel, first and second gate lines GLn and GLn+1 related to the one pixel, and first and second data lines DLm and DLm+1 related to the one pixel have been shown in FIGS. 8 and 9.

In detail, the array substrate 100 includes a first base substrate 110 formed of a transparent insulating substrate. A gate line part is disposed on the first base substrate 110, and the gate line part includes the first and second gate lines GLn and GLn+1, first and second storage lines SLn and SLn+1, and first to fourth branch electrodes LSLn, RSLn, LSLn+1, and RSLn+1.

The array substrate 100 includes a gate insulating layer 151 to cover the gate line part, and a data line part including the first and second data lines DLm and DLm+1 is disposed on the gate insulating layer 151. The data line part is covered by a protective layer 152, and an organic insulating layer 153 is disposed on the protective layer 152.

A pixel electrode is disposed on the organic insulating layer 153. As an example, the pixel electrode includes a first sub-pixel electrode 141 and a second sub-pixel electrode 142. However, the pixel electrode could be further divided into three or more pixel electrodes.

The array substrate 100 further includes a first alignment layer 160 to cover the first and second sub-pixel electrodes 141 and 142. The first alignment layer 160 may include a polymer material in which a decomposition reaction, a dimerization reaction, or an isomerization reaction occurs by irradiating light, such as ultraviolet light, laser, etc. In addition, the first alignment layer 120 may be obtained by blending a cinnamate oligomer and cinnamate-based polymer.

In addition, the opposite substrate 200 includes a second base substrate 210 facing the first base substrate 110. The second base substrate 210 includes a color filter layer 212 including red, green, and blue color pixels R, G, and B and black matrix 241. A common electrode 211 is disposed on the color filter layer 212. The common electrode 211 faces the first and second sub-pixel electrodes 141 and 142.

The opposite substrate 200 further includes a second alignment layer 220 to cover the common electrode 211. The second alignment layer 220 may include a polymer material in which a decomposition reaction, a dimerization reaction, or an isomerization reaction occurs by irradiating light, such as ultraviolet light, laser, etc. In addition, the second alignment layer 220 may be obtained by blending a cinnamate oligomer and cinnamate-based polymer.

As shown in FIG. 8, each pixel PX disposed on the array substrate 100 includes a first sub-pixel SPX1 and a second sub-pixel SPX2. The first sub-pixel SPX1 includes a first thin film transistor Tr1 and the first sub-pixel electrode 141, and the second sub-pixel SPX2 includes a second thin film transistor Tr2, the second sub-pixel electrode 142, a third thin film transistor Tr3, and a coupling capacitor Ccp. The first and second sub-pixels SPX1 and SPX2 are disposed between the first data line DLm and the second data line DLm+1 adjacent to the first data line DLm.

The first thin film transistor Tr1 is connected to the first data line DLm and the first gate line GLn and the second thin film transistor Tr2 is connected to the first data line DLm and the first gate line GLn. In detail, the first thin film transistor Tr1 includes a first source electrode SE1 connected to the first data line DLm, a first gate electrode GE1 connected to the first gate line GLn, and a first drain electrode DE1 connected to the first sub-pixel electrode 141. In addition, the first sub-pixel electrode 141 is overlapped with the first storage line SLn and the first and second branch electrodes LSLn and RSLn.

The second thin film transistor Tr2 includes a second source electrode SE2 connected to the first data line DLm, a second gate electrode GE2 connected to the first gate line GLn, and a second drain electrode DE2 connected to the second sub-pixel electrode 142. In addition, the second sub-pixel electrode 142 is overlapped with the second storage line SLn+1 and the third and fourth branch electrodes LSLn+1 and RSLn+1.

When a first gate signal is applied to the first gate line GLn, the first and second thin film transistors Tr1 and Tr2 are substantially simultaneously turned on. The data voltage applied to the first data line DL1 is charged in the first and second sub-pixel electrodes 141 and 142 through the first and second thin film transistors Tr1 and Tr2, respectively.

The third thin film transistor Tr3 includes a third source electrode SE3 connected to the second drain electrode DE2 of the second thin film transistor Tr2, a third gate electrode GE3 connected to the second gate line GLn+1, and a third drain electrode DE3 connected to the coupling capacitor Ccp. As an example, the coupling capacitor Ccp may include a first electrode CE1 branched from the third drain electrode DE3 and a second electrode CE2 branched from the second branch electrode RSLn to face the first electrode CE1 while interposing an insulating layer (not shown) between the first and second electrodes CE1 and CE2. However, the structure of the coupling capacitor Ccp should not be limited to the above-mentioned structure. For example, the size of the first electrode CE1 may be greater than that of the second electrode CE2, or the area of overlap between the electrodes CE1 and CE2 may be larger or smaller than that shown in FIG. 8 depending on a desired capacitance of the coupling capacitor Ccp.

The second gate line GLn+1 is applied with a second gate signal that rises after the fall transition of the first gate signal. When the third thin film transistor Tr3 is turned on in response to the second gate signal, the pixel voltage applied to the second sub-pixel electrode 142 decreases by the coupling capacitor Ccp. The decrease in size of the pixel voltage may depend on the charge rate of the coupling capacitor Ccp.

Consequently, after the second gate signal is generated, the first and second sub-pixel electrodes 141 and 142 may be maintained at different pixel voltages from each other.

Each of the first and second sub-pixel electrodes 141 and 142 may be divided into first to fourth domains DM1 to DM4 having different liquid crystal alignment directions from each other. In the present exemplary embodiment, the liquid crystal alignment directions of the first to fourth domains DM1 to DM4 are rotated in a counterclockwise direction. However, the liquid crystal alignment directions of the first to fourth domains DM1 to DM4 may be rotated in a clockwise direction. Further, the alignment directions of the first sub-pixel electrode 141 may be different from those of the second sub-pixel electrode 142.

Figure 10A:
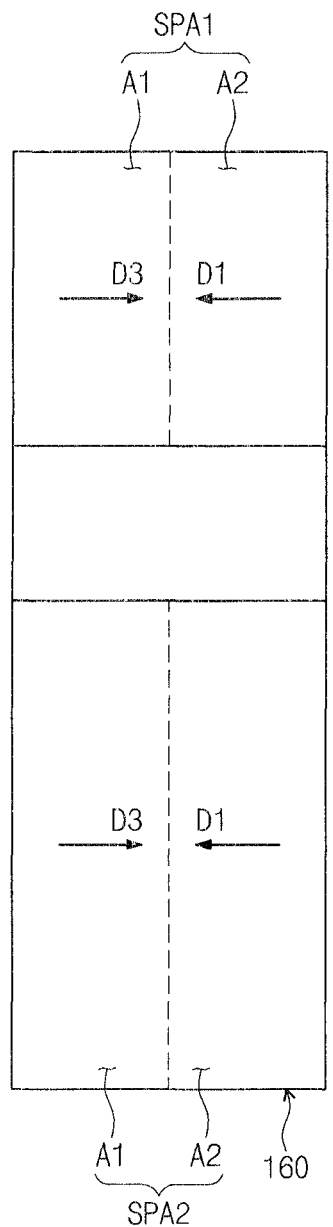
FIG. 10A is a plan view showing an alignment direction of a first alignment layer, according to an exemplary embodiment of the present invention.

Hereinafter, the liquid crystal alignment directions of the first to fourth domains DM1 to DM4 will be described in detail with reference to FIGS. 10A to 10C. FIG. 10A is a plan view showing an alignment direction of a first alignment layer, FIG. 10B is a plan view showing an alignment direction of a second alignment layer, and FIG. 10C is a plan view showing a first sub-pixel electrode and a second sub-pixel electrode, according to exemplary embodiments of the present invention.

Referring to FIG. 10A, the first alignment layer 160 is divided into first and second areas A1 and A2 in each of a first sub-pixel area SPA1 and a second sub-pixel area SPA2. The first alignment layer 160 corresponding to the first area A1 is light-aligned in a third direction D3 opposite to the first direction D1 and the first alignment layer 160 corresponding to the second area A2 is light-aligned in the first direction D1.

Figure 10B:
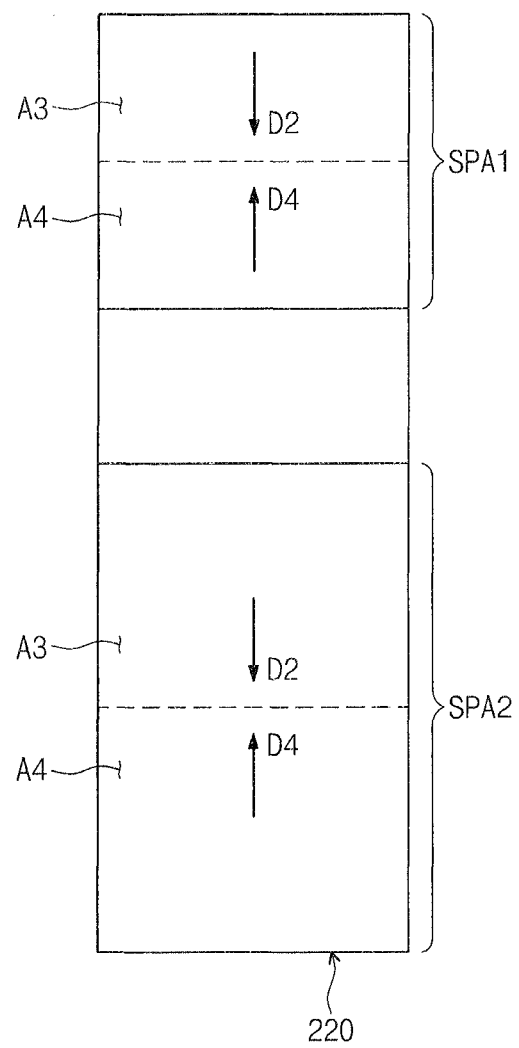
FIG. 10B is a plan view showing an alignment direction of a second alignment layer, according to an exemplary embodiment of the present invention.
Figure 10C:
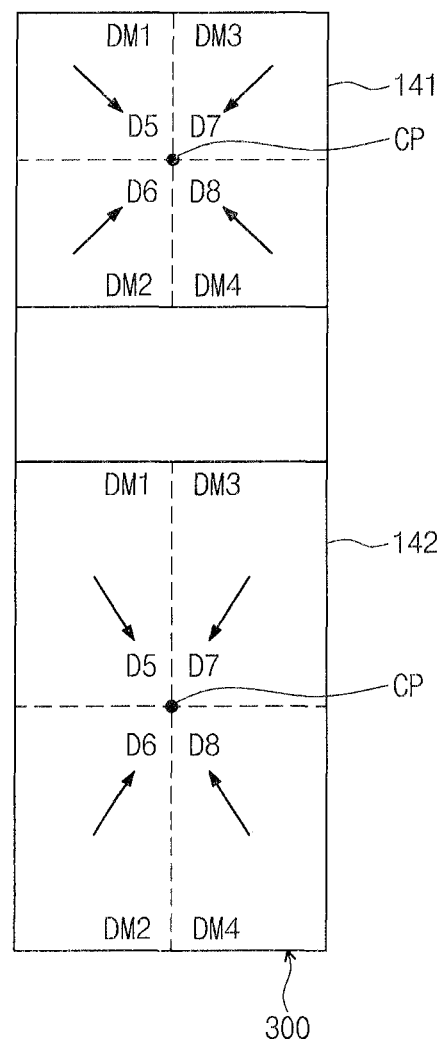
FIG. 10C is a plan view showing a first sub-pixel electrode and a second sub-pixel electrode, according to an exemplary embodiment of the present invention.

Referring to FIG. 10B, the second alignment layer 220 is divided into a third area A3 and a fourth area A4 in each of the first and second sub-pixel areas SPA1 and SPA2. The second alignment layer 220 is light-aligned in the second direction D2 in the third area A3 and the second alignment layer 220 is light-aligned in a fourth direction D4 opposite to the second direction D2 in the fourth area A4.

Alternatively, the first and second areas A1 and A2 of the first alignment layer 160 can be light aligned in the first and third directions D1 and D3, respectively, the second and fourth directions D2 and D4, respectively, or the fourth and second directions D4 and D2, respectively. The third and fourth areas A3 and A4 of the second alignment layer 220 can be light aligned in the fourth and second directions D4 and D2, respectively, the third and first directions D3 and D1, respectively, or the first and third directions D1 and D3, respectively.

When the array substrate 100 is coupled to the opposite substrate 200 to face the opposite substrate 200, the first to fourth domains DM1 to DM4 are formed in each of the first and second sub-pixel electrodes 141 and 142 as shown in FIG. 10C. In detail, the first domain DM1 is obtained by overlapping the first area A1 and the third area A3, the second domain DM2 is obtained by overlapping the first area A1 and the fourth area A4, the third domain DM3 is obtained by overlapping the second area A2 and the third area A3, and the fourth domain DM4 is obtained by overlapping the second area A2 and the fourth area A4.

The liquid crystal molecules in the first to fourth domains DM1 to DM4 may be aligned in different directions. In detail, the liquid crystal molecules in the first domains DM1 are aligned in a fifth direction D5 defined by a vector sum of the second and third directions D2 and D3, the liquid crystal molecules in the second domains DM2 are aligned in a sixth direction D6 defined by a vector sum of the third and fourth directions D3 and D4, the liquid crystal molecules in the third domain DM3 are aligned in a seventh direction D7 defined by a vector sum of the first and second directions D1 and D2, and the liquid crystal molecules in the fourth domain DM4 are aligned in an eighth direction D8 defined by a vector sum of the first and fourth directions D1 and D4.

Thus, as shown in FIG. 10C, the alignment directions of the liquid crystal molecules in the liquid crystal layer 300 in the first to fourth domains DM1 to DM4 may be directed to a center portion CP where the first to fourth domains DM1 to DM4 meet to each other. As described above, the plural domains, e.g., the first to fourth domains DM1 to DM4, having the different alignment directions are formed in each of the first and second sub-pixel areas SPA1 and SPA2, thereby widening the viewing angle of the liquid crystal display.

As shown in FIGS. 1 and 6, the UV light pulses are irradiated onto the alignment layer 120 while being inclined with respect to the upper surface of the alignment layer 120. When irradiating the UV light pulses, a boundary portion between the first and second areas A1 and A2 may be exposed twice due to a shadow effect according to a distance between the mask 130 and the substrate 110. The double exposure can be prevented by employing the masks of FIGS. 11A and 11B.

Figure 11A:
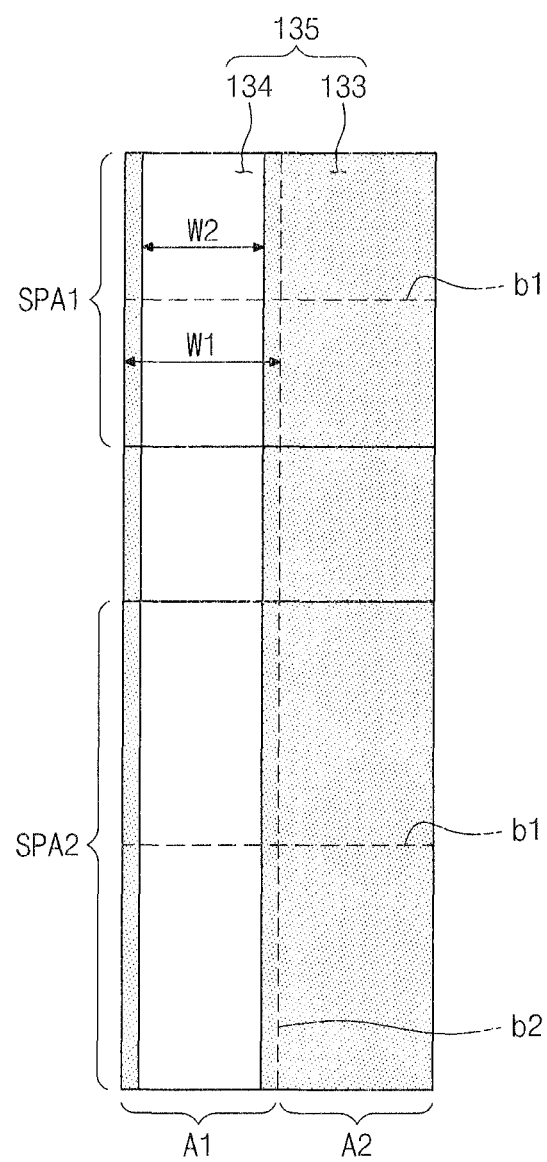
FIG. 11A is a plan view showing a first mask used to expose a first alignment layer according to an exemplary embodiment of the present invention.
Figure 11B:
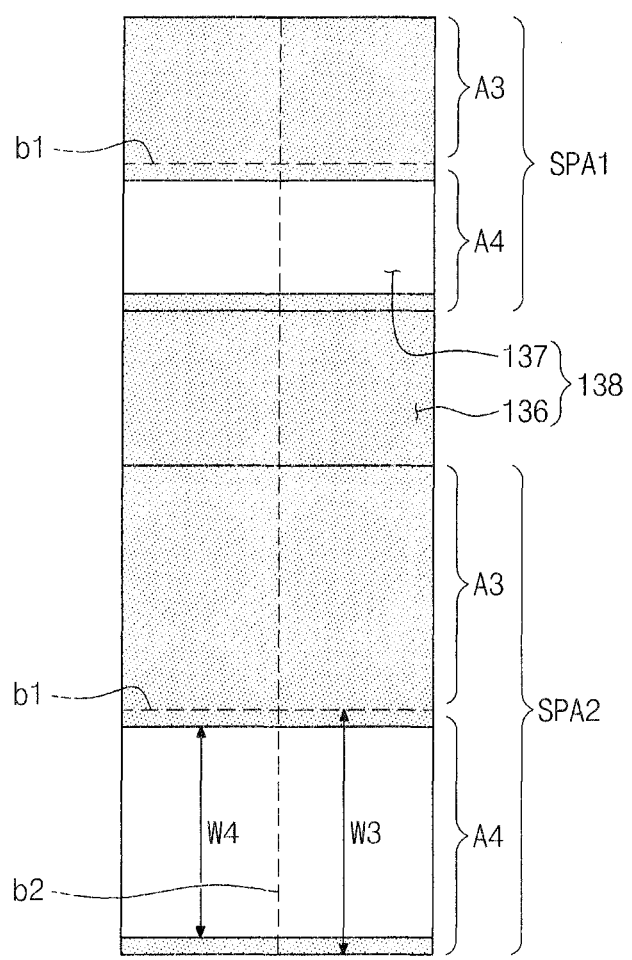
FIG. 11B is a plan view showing a second mask used to expose a second alignment layer according to an exemplary embodiment of the present invention.

FIG. 11A is a plan view showing a first mask used to expose a first alignment layer according to an exemplary embodiment of the present invention and FIG. 11B is a plan view showing a second mask used to expose a second alignment layer according to an exemplary embodiment of the present invention.

Referring to FIG. 11A, a first mask 135 is disposed on the first alignment layer 160 to perform the exposure process. The first mask 135 includes a light blocking part 133 and a light transmitting part 134. As described above, the first alignment layer 160 is divided into the first and second areas A1 and A2 in each of the first and second sub-pixel areas SPA1 and SPA2. FIG. 11A shows the light transmitting part 134 of the first mask 135, which is positioned to correspond to the first area A1.

As an example, when the first area A1 of the first alignment layer 160 has a first width W1, the light transmitting part 134 of the first mask 135 may have a second width W2 that is equal to or smaller than the first width W1 of the first area A1. In the present exemplary embodiment, the second width W2 of the light transmitting part 134 is smaller than the first width W1 of the first area A1 as shown in FIG. 11A Referring to FIG. 11B, a second mask 138 is disposed on the second alignment layer 220 to perform the exposure process. The second mask 138 includes a light blocking part 136 and a light transmitting part 137. As described above, the second alignment layer 220 is divided into the third and fourth areas A3 and A4 in each of the first and second sub-pixel areas SPA1 and SPA2. FIG. 11B shows the light transmitting part 137 of the second mask 138, which is positioned to correspond to the fourth area A4.

The light transmitting part 137 of the second mask 138 may have a fourth width W4 that is equal to or smaller than a third width W3 of the third area A3.

In the present exemplary embodiment, the light transmitting part 137 has the fourth width W4 smaller than the third width W3 of the fourth area A4. Because the fourth width W4 is smaller than the third width W3 of the fourth area A4, a first boundary portion b1 between the third and fourth areas A3 and A4 may not be exposed twice. Further, because the light transmitting part 134 in FIG. 11A has the second width W2 that is smaller than the first width W1 of the first area A1, a second boundary portion b2 between the first and second areas A1 and A2 may not be exposed twice.

For example, referring to FIGS. 11A and 11B, the first boundary portion b1 between the third and fourth areas A3 and A4 in the first alignment layer 160 is exposed to light through the light transmitting part 134 of the first mask 135. However, the first boundary portion b1 in the second alignment layer 220 is covered by the light blocking part 136 of the second mask 138, so that the first boundary portion b1 in the second alignment layer 220 is not exposed to the light. Thus, the pretilt angle is formed in the first boundary portion b1 of the first alignment layer 160 and not formed in the first boundary portion b1 of the second alignment layer 220.

As described above, the second boundary portion b2 between the first and second areas A1 and A2 in the second alignment layer 220 is exposed to the light through the light transmitting part 137 of the second mask 138. However, the second boundary portion b2 in the first alignment layer 160 is covered by the light blocking part 133 of the first mask 135, so that the second boundary portion b2 in the first alignment layer 160 is not exposed to the light. Thus, the pretilt angle is formed in the second boundary portion b2 of the second alignment layer 220 and not formed in the second boundary portion b2 of the first alignment layer 160.

Figure 12A:
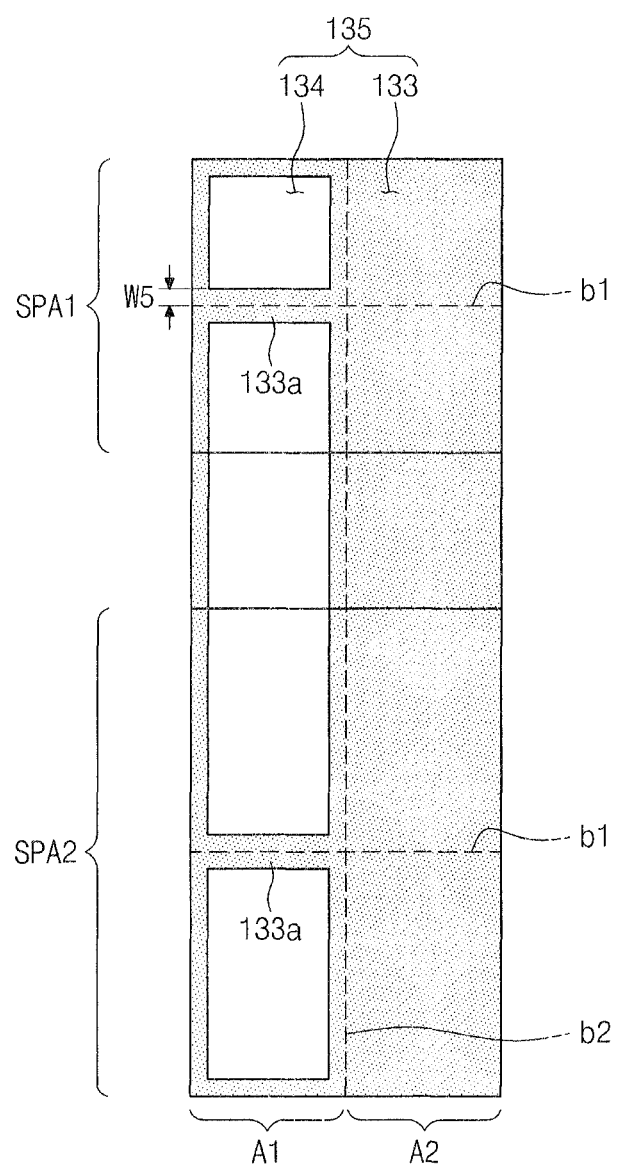
FIG. 12A is a plan view showing a first mask used to expose a first alignment layer according to an exemplary embodiment of the present invention.
Figure 12B:
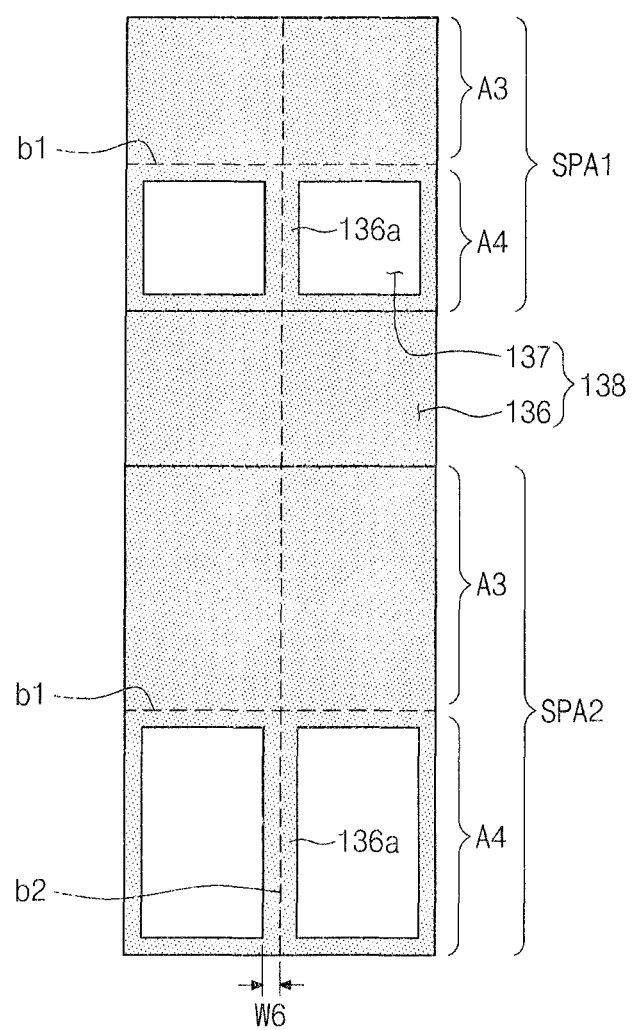
FIG. 12B is a plan view showing a second mask used to expose a second alignment layer according to an exemplary embodiment of the present invention.

FIG. 12A is a plan view showing a first mask used to expose a first alignment layer according to an exemplary embodiment of the present invention and FIG. 12B is a plan view showing a second mask used to expose a second alignment layer according to an exemplary embodiment of the present invention.

FIGS. 12A and 12B show the first alignment layer 160 having the first and second boundary portions b1 and b2 in which the pretilt angle is not formed and the second alignment layer 220 having the first and second boundary portions b1 and b2 in which the pretilt angle is not formed.

Referring to FIG. 12A, the first mask 135 further includes a dummy light blocking part 133a to cover the first and second boundary portions b1 and b2. The dummy light blocking part 133a is integrally formed with the light blocking part 133. In addition, the dummy light blocking part 133a of the first mask 135 may have the same width W5 in upper and lower directions in the first area A1 with reference to the first boundary portion b1.

Referring to FIG. 12B, the second mask 138 further includes a dummy light blocking part 136a to cover the first and second boundary portions b1 and b2. The dummy light blocking part 136a is integrally formed with the light blocking part 136. In addition, the dummy light blocking part 136a of the second mask 138 may have the same width W6 in upper and lower directions in the fourth area A4 with reference to the second boundary portion b2.

As shown in FIGS. 12A and 12B, when the first and second masks 135 and 138 include the dummy light blocking parts 133a and 136a, a domain boundary texture area (which hereinafter may be referred to as the DBT area) formed in the boundary portion between the first to fourth domains DM1 to DM4 (shown in FIG. 8) increases.

Hereinafter, a method of reducing the width of the DBT area will be described with reference to FIG. 13.

Figure 13:
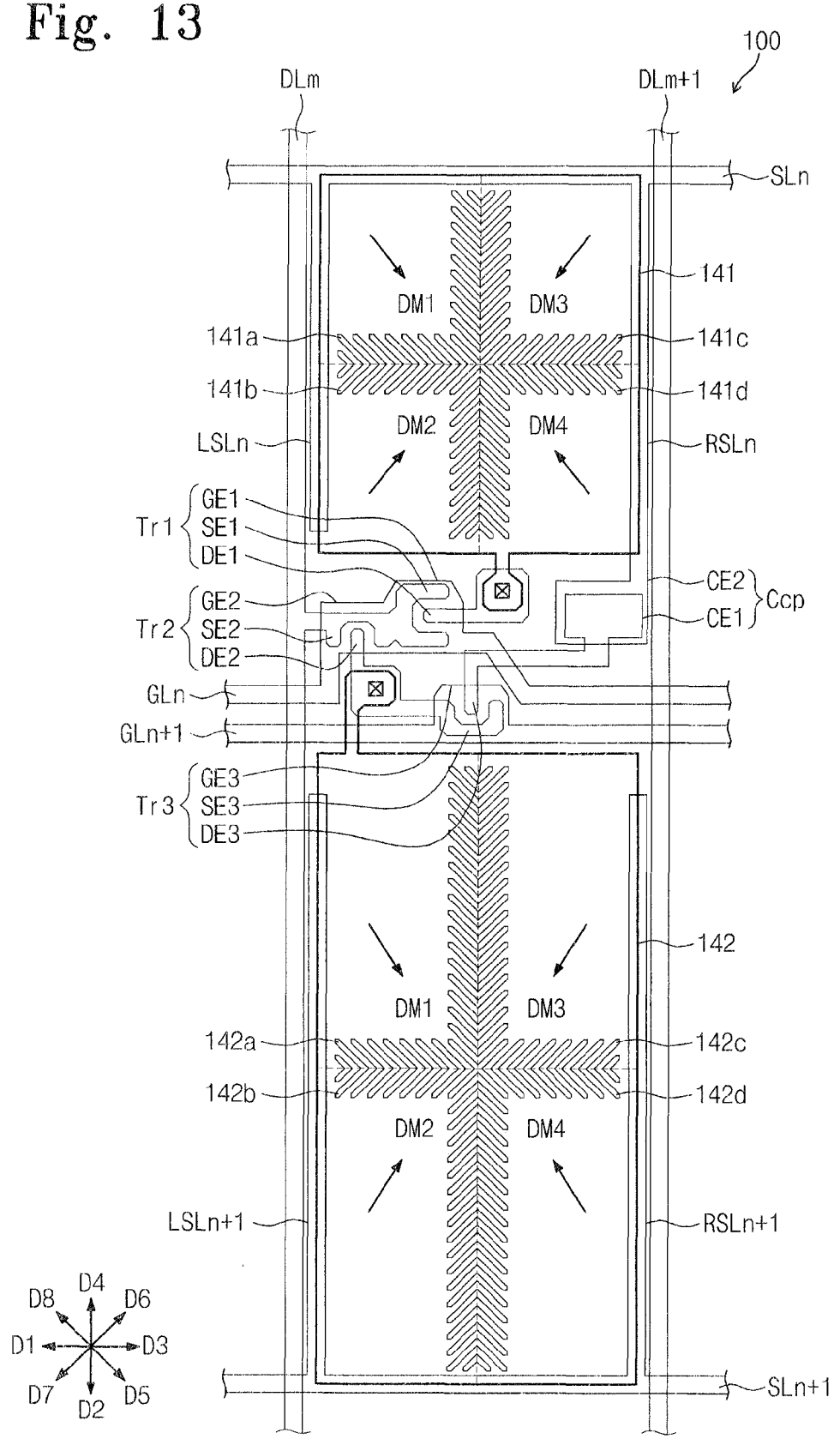
FIG. 13 is a plan view showing a pixel part according to an exemplary embodiment of the present invention.

FIG. 13 is a plan view showing a pixel part according to an exemplary embodiment of the present invention. In FIG. 13, the same reference numerals denote the same elements in FIG. 8, and thus a detailed description of the same elements will be omitted.

Referring to FIG. 13, the pixel part of the liquid crystal display panel has the same structure as that of the liquid crystal display panel shown in FIG. 8 except for the slits. In detail, the first sub-pixel electrode 141 includes first to fourth slits 141a, 141b, 141c, and 141d and the second sub-pixel electrode 142 includes fifth to eighth slits 142a, 142b, 142c, and 142d.

More particularly, the first sub-pixel electrode 141 includes the first to fourth slits 141a to 141d respectively corresponding to the first to fourth domains DM1 to DM4 (shown in FIG. 8). As an example, the first to fourth slits 141a to 141d may be extended in directions substantially parallel to the liquid crystal alignment directions of the first to fourth domains DM1 to DM4, respectively. However, the first to fourth slits 141a to 141d may be arranged in other directions, such as perpendicular to the liquid crystal alignment directions of the first to fourth domains DM1 to DM4, respectively.

Accordingly, although the boundary portion between the first to fourth domains DM1 to DM4 is not exposed, the liquid crystal molecules may be aligned in the direction substantially parallel to the slits in each domain DM1 to DM4 by the first to fourth slits 141a to 141d. Thus, the width of the DBT area formed in the boundary portion between the first, second, third, and fourth domains DM1, DM2, DM3, and DM4 may be reduced, thereby improving an aperture ratio and a transmittance of each pixel.

The first slits 141a are arranged along sides of the first domain DM1, which are adjacent to sides of the second and third domains DM2 and DM3, to have an L-like shape, and the second slits 141b are arranged along sides of the second domain DM2, which are adjacent to sides of the first and fourth domains DM1 and DM4, to have an L-like shape. In addition, the third slits 141c are arranged along sides of the third domain DM3, which are adjacent to sides of the first and fourth domains DM1 and DM4, to have an L-like shape, and the fourth slits 141d are arranged along sides of the fourth domain DM4, which are adjacent to sides of the second and third domains DM2 and DM3, to have an L-like shape.

However, the slits 141a-141d are not limited to the arrangement shown. For example, the slits 141a-141d may be arranged on all four sides of the domains DM1 to DM4, or just on the sides of the domains DM1 to DM4 on which they are not shown being formed in FIG. 13.

As shown in FIG. 13, the fifth to eighth slits 142a to 142d may have the same shapes as those of the first to fourth slits 141a to 141d.

As an example, each of the first to fourth slits 141a to 141d may have a length corresponding to 0.1 times the width of the first sub-pixel electrode 141. In addition, the entire area of the first to fourth slits 141a to 141d corresponds to about 10% to about 90% of the entire area of the first sub-pixel electrode 141.

Exemplary embodiments of the present invention provide a method of forming a vertical alignment layer, a method of manufacturing a display apparatus using the same and a display apparatus made with the manufacturing method.

In the method of forming the vertical alignment layer, a scan exposure apparatus outputs pulses of light onto first areas of an alignment layer using a mask, and then, outputs pulses of light onto second areas of the alignment layer using the same mask to complete the formation of the vertical alignment layer, thereby using a reduced number of masks and simplifying the manufacturing processes of the vertical alignment layer. In addition, the display apparatus may be manufactured with sub-pixel electrodes fashioned with slits that define domains. Accordingly, a domain boundary texture area formed in the boundary portion between the domains decreases, thereby improving the aperture ratio and transmittance of a pixel.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A method of forming a vertical alignment layer, comprising:
   disposing a substrate on a stage, the substrate comprising an alignment layer, wherein the alignment layer comprises first areas and second areas alternately arranged in a first direction;
   disposing a mask over the substrate, the mask comprising light blocking parts that block light and light transmitting parts through which light passes and that correspond to the first areas;
   disposing an exposure apparatus over the mask;
   providing, from the exposure apparatus, first light pulses to the first areas while the substrate moves in the first direction to form a pretilt angle in the first areas;
   rotating the stage so that the light transmitting parts correspond to the second areas; and
   providing, from the exposure apparatus, second light pulses to the second areas while the substrate moves in the first direction to form a pretilt angle in the second areas,
   wherein the pretilt angle formed in the first areas is different from the pretilt angle formed in the second areas,
   wherein the first and second areas extend in a second direction substantially perpendicular to the first direction, the first areas are light aligned in the first direction, and the second areas are light aligned in a third direction opposite to the first direction.

2. The method of claim 1, wherein an area of the substrate that is exposed for a time through the mask is defined as a first exposure area, N pitches repeatedly appear in the first exposure area, each pitch is a period of time where one of the light transmitting parts and one of the light blocking parts overlaps a portion of the first exposure area, and N is a constant number.

3. The method of claim 2, wherein a moving speed of the substrate satisfies the following Equation, $$v=(P1 \times n)/T1$$

where P1 denotes one of the pitches, n is a constant number smaller than N, and T1 denotes one period of the first or second light pulses.

4. The method of claim 3, wherein the difference between the pretilt angle of the first areas and the pretilt angle of the second areas is about 180 degrees.

5. The method of claim 3, wherein the exposure apparatus is turned on during a first time interval of the one period to output the first or second light pulse and is turned off during a second time interval of the one period not to output the first or second light pulse.

6. The method of claim 5, wherein a moving distance of the substrate during the first time interval is defined as d1, and d1 satisfies the following Equation, $$d1 = \frac{H1}{T1}(P1 \times n)$$

where H1 denotes the first time interval.

7. A method of manufacturing a display apparatus, comprising:
   forming a first alignment layer on a first substrate, wherein the first substrate includes a plurality of pixel electrodes;
   forming a second alignment layer on a second substrate, wherein the second substrate includes a reference electrode;
   disposing a liquid crystal layer between the first alignment layer and the second alignment layer, the liquid crystal layer comprising liquid crystal molecules that are vertically aligned with respect to the first or second alignment layer,
   wherein at least one of the first alignment layer or the second alignment layer comprises first areas and second areas alternately arranged in a first direction, and the at least one alignment layer is formed by:
   disposing a substrate having the at least one alignment layer on a stage;
   disposing a mask over the substrate, the mask comprising light blocking parts that block light and light transmitting parts through which light passes and that corresponds to the first areas;
   disposing an exposure apparatus over the mask;
   providing, from the exposure apparatus, first light pulses to the first areas while the substrate moves in the first direction to form a pretilt angle in the first areas;
   rotating the stage so that the light transmitting parts correspond to the second areas; and
   providing, from the exposure apparatus, second light pulses to the second areas while the substrate moves in the first direction to form a pretilt angle in the second areas,
   wherein the pretilt angle formed in the first areas is different from the pretilt angle formed in the second areas.

8. The method of claim 7, wherein the at least one alignment layer divides a pixel electrode into a plurality of domains to pretilt the liquid crystal molecules in the domains.

9. The method of claim 8, wherein the other of the first and second alignment layers is formed in substantially the same way as the at least one alignment layer, the first and second areas in the first and second alignment layers extend in a second direction substantially perpendicular to the first direction, the first areas in the first alignment layer are light aligned in the first direction, the second areas in the first alignment layer are light aligned in a third direction opposite to the first direction, the first areas of the second alignment layer are light aligned in the second direction, and the second areas of the second alignment layer are light aligned in a fourth direction opposite the second direction.

10. The method of claim 7, wherein an area of the substrate that is exposed for a time through the mask is defined as a first exposure area, N pitches repeatedly appear in the first exposure area, each pitch is a period of time where one of the light transmitting parts and one of the light blocking parts overlaps a portion of the first exposure area, and N is a constant number.

11. The method of claim 10, wherein a moving speed of the substrate satisfies the following Equation, $$v=(P1\times n)/T1$$

where P1 denotes one of the pitches, n is a constant number smaller than N, and T1 denotes one period of the first or second light pulses.

12. The method of claim 11, wherein the exposure apparatus is turned on during a first time interval of the one period to output the first or second light pulse and is turned off during a second time interval of the one period not to output the first or second light pulse.

13. The method of claim 12, wherein a moving distance of the substrate during the first time interval is defined as d1, and d1 satisfies the following Equation, $$d1 = \frac{H1}{T1}(P1 \times n)$$

where H1 denotes the first time interval.

14. A display apparatus, comprising:
a first substrate comprising a plurality of pixel electrodes;
a second substrate comprising a reference electrode facing the pixel electrodes;
a liquid crystal layer disposed between the first substrate and the second substrate and including a plurality of liquid crystal molecules;
a first alignment layer disposed on the pixel electrodes; and
a second alignment layer disposed on the reference electrode,
wherein at least one of the first alignment layer or the second alignment layer divides a first pixel electrode into a plurality of domains to pretilt the liquid crystal molecules in each domain, and the first pixel electrode comprises a plurality of slits formed in each domain,
wherein the slits foamed in each domain extend in a direction substantially parallel to an alignment direction of the liquid crystal molecules of that domain,
wherein the alignment directions of the liquid crystal molecules in the domains are directed to a center portion where the domains meet each other.

15. The display apparatus of claim 14, wherein the slits are formed adjacent to a boundary between the domains.

16. The display apparatus of claim 14, wherein the first pixel electrode comprises a first sub-pixel electrode and a second sub-pixel electrode, and the first sub-pixel electrode receives a voltage different from a voltage received by the second sub-pixel electrode.

17. A method of forming a vertical alignment layer, comprising:
irradiating a first area of an alignment layer with first light passing through a mask to form a pretilt angle in the first area, wherein the mask is positioned to prevent a second area of the alignment layer from being exposed by the first light, and wherein the alignment layer is in a first position;
moving the alignment layer to a second position; and
while the alignment layer is in the second position, irradiating the second area with second light passing through the mask to form a pretilt angle in the second area, wherein the first area is prevented from being exposed by the second light, and wherein the pretilt angle in the first area is different from the pretilt angle in the second area,
wherein the first area of the alignment layer that is exposed for a time through the mask is defined as a first exposure area, N pitches repeatedly appear in the first exposure area, each pitch is a period of time where a light transmitting part of the mask and a light blocking part of the mask overlaps a portion of the first exposure area, and N is a constant number,
wherein a moving speed of the alignment layer satisfies the following Equation, $$v=(P1\times n)/T1$$

where P1 denotes one of the pitches, n is a constant number smaller than N, and T1 denotes one period of the first or second light.

* * * * *